United States Patent
Collins et al.

(10) Patent No.: US 6,250,153 B1
(45) Date of Patent: Jun. 26, 2001

(54) CONTINUOUS, NON-METALLIC, MEDIA SENSORS FOR CORROSIVE ENVIRONMENTS

(75) Inventors: Timothy R. Collins, Cologne; Michael L. Henning, Redwood Falls, both of MN (US)

(73) Assignee: Sensor Measurement Technology, Redwood Falls, MN (US)

( * ) Notice: Subject to any disclaimer, the term of this patent is extended or adjusted under 35 U.S.C. 154(b) by 0 days.

(21) Appl. No.: 09/138,855

(22) Filed: Aug. 24, 1998

Related U.S. Application Data

(63) Continuation-in-part of application No. 09/110,799, filed on Jul. 6, 1998, now abandoned.

(51) Int. Cl.[7] .................................................. G01F 23/00
(52) U.S. Cl. ............................................................ 73/304 C
(58) Field of Search ............................. 73/304 R, 304 C, 73/295

(56) References Cited

U.S. PATENT DOCUMENTS

| | | | |
|---|---|---|---|
| 4,428,026 | * 1/1984 | Maltby et al. | 73/304 C |
| 4,511,948 | * 4/1985 | Maltby et al. | 361/280 |
| 4,590,797 | * 5/1986 | Beaubatie et al. | 73/295 |
| 4,663,614 | 5/1987 | Rauchwerger | 340/605 |
| 5,057,813 | 10/1991 | Sasaki et al. | 340/450.3 |
| 5,137,370 | * 8/1992 | McCulloch et al. | 374/173 |
| 5,316,035 | 5/1994 | Collins et al. | 137/312 |
| 5,449,017 | 9/1995 | Collins et al. | 137/312 |
| 5,481,197 | * 1/1996 | Sanders et al. | 324/690 |
| 5,501,102 | 3/1996 | Williamson | 73/304 R |
| 5,581,019 | * 12/1996 | Minor et al. | 73/115 |
| 5,626,053 | 5/1997 | Williamson | 73/304 R |
| 5,643,502 | * 7/1997 | Nahass et al. | 252/511 |
| 5,661,405 | 8/1997 | Simon et al. | 324/697 |
| 5,992,251 | * 11/1999 | Grieger et al. | 73/866.5 |

FOREIGN PATENT DOCUMENTS

| | | |
|---|---|---|
| 1 465 417 | 2/1977 | (GB) . |
| 2 060 893 | 5/1981 | (GB) . |
| 2 136 965 | 9/1984 | (GB) . |

* cited by examiner

*Primary Examiner*—Hezron Williams
*Assistant Examiner*—Willie Morris Worth
(74) *Attorney, Agent, or Firm*—Merchant & Gould P.C.

(57) ABSTRACT

Sensors for use in sensing the level and temperature of a corrosive medium contained in a container. The sensors have particular use in the semiconductor manufacturing industry, however the sensors also have applications in the biotech, pharmaceutical, plating, chemical, petroleum, etc. industries. The sensors comprise first and second elongate, conductive sensor members, each of which has a longitudinal axis and is dimensioned to extend into the medium. The first and second sensor members each include a core that is made from a non-metallic, electrically resistive material having a plurality of non-metallic conductive fibers embedded therein. Each core has opposite ends and the fibers are oriented parallel to the longitudinal axis of the first and second sensor members and extend continuously substantially between the ends of the cores. Media level can be sensed by comparing the capacitance of the sensor members, which changes as the level of the media changes. By interconnecting the ends of the cores with a conductive member, a sensor is formed that can be used to sense the temperature of the media.

20 Claims, 4 Drawing Sheets

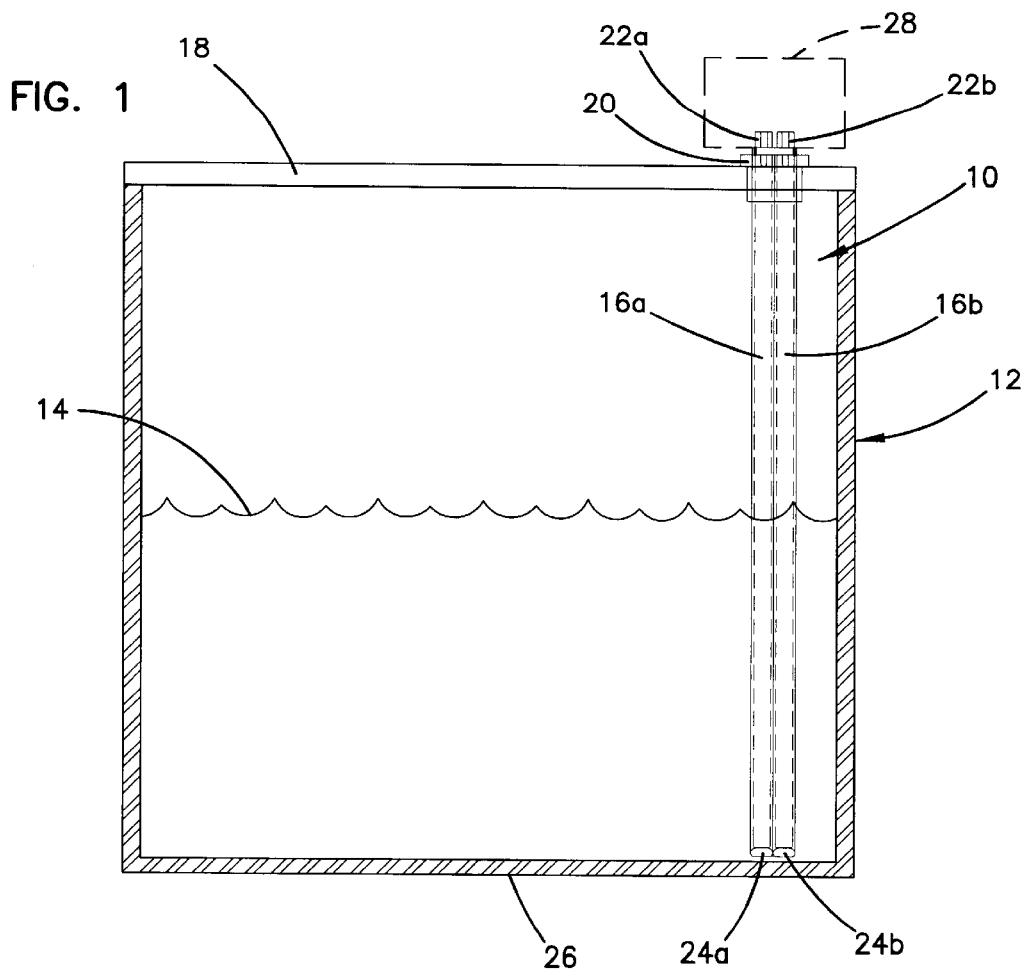
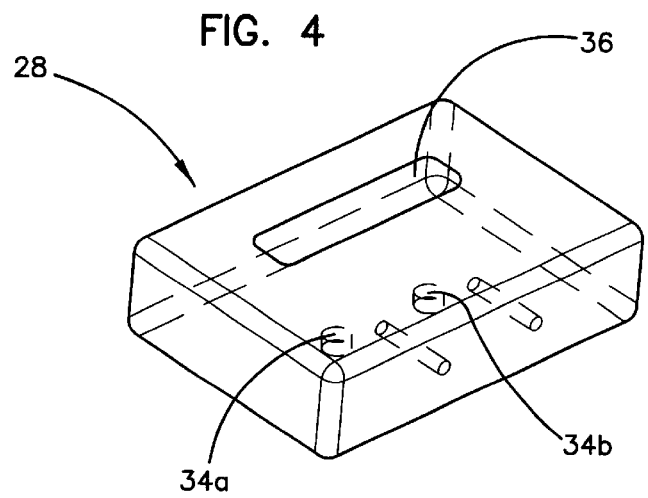

CONTINUOUS, NON-METALLIC, MEDIA SENSORS FOR CORROSIVE ENVIRONMENTS

This application is a continuation-in-part of Application No. 09/110,799, filed Jul. 6, 1998, now abandoned.

FIELD OF THE INVENTION

This invention relates to sensors for sensing a medium within a container. More particular, this invention relates to non-metallic sensors for use in sensing certain conditions, such as medium level and temperature, of a corrosive medium, such as those encountered in the semiconductor industry in the processing of semiconductor wafers into circuit chips.

BACKGROUND OF THE INVENTION

In many industries it is important, and indeed even crucial, to monitor the conditions of a liquid within a housing or container. Monitoring of the liquid conditions is typically achieved using one or more gauges which extend into the housing and into contact with the liquid. However, in the semiconductor industry especially, and in other industries as well, extremely severe conditions are often times encountered within liquid containers due to the highly corrosive nature of many liquids.

Corrosive liquids are extremely hard on many gauges because metals which are used in conventional gauges cannot reliably withstand the corrosive environment for long periods of time. Thus, not only must conventional gauges be frequently replaced, thereby increasing costs, the processing equipment associated with the container must be shut down during gauge replacement, thereby affecting production and further increasing costs.

Conventional sensors are disclosed in U.S. Pat. Nos. 5,501,102 and 5,626,053 to Williamson. In these sensors, a pair of non-metallic, resistive/conductive members are provided in order to prevent corrosion by the corrosive environment within the container. The resistive/conductive members are formed from conductive, chopped carbon fibers embedded within a polymeric material. These sensors rely upon either a change in voltage or a change in current between the two members, which are in direct contact with the liquid, to provide an indication of the liquid level in the container. The resistive/conductive members, however, have a relatively high resistance, due to the chopped carbon fibers, which do not electrically align during formation of the members.

Another conventional sensor device is disclosed in U.S. Pat. No. 5,057,813 to Sasaki et al. This device is a digital output device for sensing whether a liquid, in this case oil, falls below a predetermined level. A metallic electrode is disposed inside of a sensor body, and the resistance between the sensor body and the electrode is detected to determine the oil level. This device, however, is not able to continuously sense the oil level. Further, due to the metallic nature of the electrode, this device would not be practical for use in highly corrosive environments.

U.S. Pat. No. 5,661,405 to Simon et al. discloses a sensor for us in electrically conductive liquids. The sensor uses two flexible ribbon electrodes surrounded by a pair of flexible sleeves. Each electrode is made from a carbon filled, silicon rubber material. Silicon rubber material offers very limited corrosion resistance and is therefore not suited for use in corrosive environments. Further, silicon is forbidden in the presence of silicone wafers during semiconductor manufacturing, and thus this sensor is not suitable for use in the semiconductor industry.

Therefore, there is a need for sensors that overcome the disadvantages of previous sensors. Further, there is a need for improved sensors for use in highly corrosive media, such as those used in the semiconductor industry, for sensing the conditions of the media.

SUMMARY OR THE INVENTION

The present invention provides improved sensors for use in sensing various conditions of a corrosive medium contained in a container. In particular, the sensors of the present invention can be used to sense the level and temperature of the corrosive medium in the container. The sensors have particular use in the semiconductor manufacturing industry, however the sensors have applications in the biotech, pharmaceutical, plating, chemical, petroleum, etc. industries as well. An advantage of the invention is that the conditions of the media can be continuously sensed, thereby providing an accurate indication of the media conditions at any point in time. Further, the sensors of the present invention are designed to reduce the chance of contamination of the media, as well as being designed with a reduced electrical resistance. Even further, the sensors of the present invention are simple in construction and use, and can be used to sense the level or temperature of liquid, gaseous, or solid media.

In one embodiment in accordance with the invention, a sensor for use within a container containing a medium is provided. The sensor comprises first and second elongate, conductive sensor members, each of which has a longitudinal axis and is dimensioned to extend into the medium. The first and second sensor members each include a core made from a non-metallic, electrically resistive material having a plurality of non-metallic conductive fibers embedded therein. Each core has opposite ends and the fibers are oriented parallel to the longitudinal axis of the first and second sensor members and extend continuously between the first and second ends of the cores.

In another embodiment in accordance with the present invention, a sensor member is provided comprising an elongate, conductive rod having a longitudinal axis. The rod includes a core made from a non-metallic, electrically resistive material having a plurality of non-metallic conductive fibers embedded therein. The core has opposite ends and the fibers are oriented parallel to the longitudinal axis of the rod and extend continuously between the ends of the core.

A variety of additional advantages of the invention will be set forth in part in the description which follows, and in part will be obvious from the description, or may be learned by practice of the invention. The advantages of the invention will be realized and attained by means of the elements and combinations particularly pointed out in the claims. It is to be understood that both the foregoing general description and the following detailed description are exemplary and explanatory only and are not restrictive of the invention as claimed.

BRIEF DESCRIPTION OF THE DRAWINGS

FIG. 1 illustrates a sensor in accordance with the principles of the present invention attached to a container having a corrosive media therein for sensing the level of the corrosive media.

FIG. 4 illustrates a meter that can be attached to the sensor members of the media level sensor to measure the media level.

DETAILED DESCRIPTION OF THE PREFERRED EMBODIMENT

Figure 2:
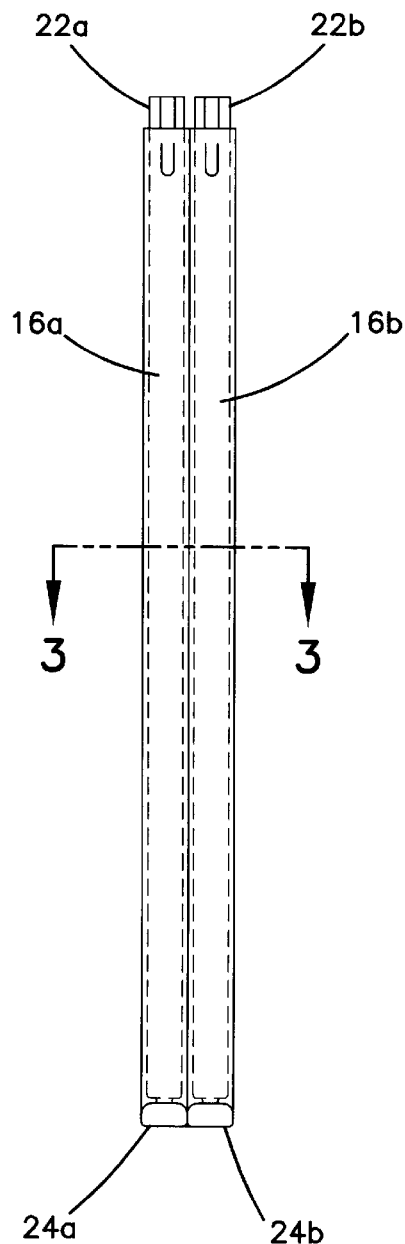
FIG. 2 is a detailed illustration of the sensor members that are used in the sensor shown in FIG. 1.

The present invention is directed toward sensors that allow continuous sensing of the level and temperature of a corrosive media within a container, as well as to sensor members for forming such sensors. The sensors have applications in the semiconductor manufacturing industry, as well as the biotech, pharmaceutical, plating, chemical, petroleum, etc. industries.

The sensors of the present invention can be used with a variety of corrosive media including, either individually or in combination, liquid, gaseous, or solid (e.g. granular) materials. Specific examples of corrosive media with which the sensors could be used include, but is not limited to: acetic acid; acetone; ammonium fluoride; ammonium hydroxide; antimony potassium tartrate; ceric ammonium nitrate; choline; EKC 130-photoresist stripper; ethylene glycol; ferric chloride; hydrochloric acid; hydrofluoric acid; hydrogen peroxide; IPA-isopropyl alcohol; methanol; n-Butyl acetate; nitric acid; PBR 1; phosphoric acid; potassium ferrocyanide; potassium hydroxide; potassium phosphate; PRS 1000; sodium hydroxide; sulfuric acid; tannic acid; TMAH-tetramethylammonium hydroxide; gasoline; etc.

With reference now to FIG. 1, a sensor 10 in accordance with the principles of the invention for sensing media level is illustrated in its operative position on a container 12 which contains a corrosive media 14, in particular a corrosive liquid, therein. Although the sensor 10 is specifically described and illustrated herein as sensing the level of a corrosive liquid, the sensor 10 could be used to sense the level of a corrosive gas, a corrosive solid (e.g. granular), or any combination of liquid, gas and solid.

The container 12 is any type of vessel or tank typically used to hold corrosive liquid, and which is formed of material(s) able to resist the corrosive affects of the liquid. Suitable materials for use in forming the container 12 include polymeric materials, glass and corrosion resistant metals. The container 12 is preferably square or cylindrical in shape whereby the corrosive liquid 14 has a constant level throughout the container 12, however the container could also have a spherical shape as well.

The sensor 10 comprises first and second sensor members 16a, 16b connected to a top wall 18 of the container 12 and extending downward into the liquid 14. The upper portions of the sensor members 16a, 16b extend through a fitting 20 that is secured to the top wall 18 whereby the sensor members 16a, 16b are fixedly secured in place on the container 12. Each sensor member 16a, 16b includes a respective first end 22a, 22b that extends above the fitting 20, with a respective second, opposite end 24a, 24b of each sensor member 16a, 16b being disposed adjacent a bottom wall 26 of the container. A meter 28 is detachably connected to the first ends 22 of the sensor members 16a, 16b to monitor the changes in the liquid level and produce an output reading indicative thereof.

The fitting 20 is formed from a material that is able to withstand the corrosive environment within the container.

Preferably, the fitting 20 is formed from a polymeric material, such as perfluoroalkoxy or polypropylene.

Figure 3:
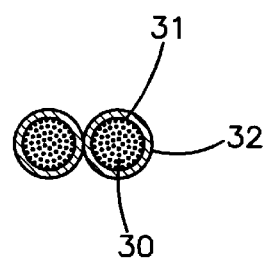
FIG. 3 is a cross-sectional view taken along line 3—3 of FIG. 2.

The sensor members 16a, 16b are illustrated in detail in FIGS. 2 and 3, where it can be seen that each sensor member 16a, 16b is formed as an elongate rod, with the sensor members 16a, 16b being integrally connected together along the lengths thereof, thereby forming a single unit. The sensor members 16a, 16b are made conductive, and the sensor 10 relies upon a capacitive comparison of the two conductive sensor members to determine the level of the liquid 14 within the container 12. The meter 28, which is connected to the conductive sensor members, senses changes in the capacitance of the sensor members 16a, 16b. The capacitance of the sensor members 16a, 16b is dependent upon the level of the liquid 14 within the container 12, with the meter 28 sensing the corresponding capacitance and producing an analog output signal proportional to the corresponding liquid level.

Due to the corrosive nature of the liquid 14, the sensor members 16a, 16b must be formed of materials that are able to withstand the corrosive liquid. With reference to FIG. 3, the sensor members 16a, 16b each include a central core 30 made from a non-metallic, electrically resistive material having a plurality of non-metallic conductive fibers 31 embedded therein, thereby rendering the core 30 conductive, with a non-metallic, electrically resistive sleeve 32 surrounding the central core 30.

The non-metallic, electrically resistive material of the core 30 preferably comprises a polymeric material, such as perfluoroalkoxy (PFA) and the like, and the non-metallic conductive fibers 31 embedded therein are preferably continuous carbon fibers. The core 30 is preferably formed by pull truding the polymeric material, with the continuous conductive fibers 31 preferably embedded in the polymeric material such that the fibers extend generally continuously between the two ends of the core 30, parallel to the longitudinal axes of the members 16a, 16b. Thus, the continuous, longitudinally extending fibers result in an electrical resistance that is much lower than that provided by chopped conductive fibers or conductive particles, since each continuous conductive fiber provides a continuous electrical path between the ends of the core. On the other hand, chopped fibers and particles are randomly oriented and do not align along the longitudinal axis, and thus an electrical path provided thereby is discontinuous and must jump from fiber to fiber.

In one embodiment of the present invention, the conductive fibers 31 each have a diameter of about 6.9 microns (i.e. 6.9 $\mu$m), with the cross-sectional area of the fibers 31 accounting for approximately 50% of the total cross-sectional area of the cores 30, regardless of the diameter of the members 16a, 16b, to provide sufficient conductivity to the members 16a, 16b. The dimensions of the core 30, in particular its length, will be selected based upon the size of the container 12 with which it is to be used. In one embodiment, the core has a diameter of about 0.25 inches. It is to be realized that the dimensions recited herein are exemplary only, and that the fibers and core could have other dimensions, and the fibers could account for a smaller or larger percentage of the total cross-sectional area of the core.

The non-metallic, electrically resistive sleeve 32 preferably comprises a polymeric material, such as perfluoroalkoxy (PFA) and the like. The sleeve 32 is resistant to the corrosive effects of the liquid 14, and shields the core 30 from the liquid 14. The sleeve 32 also gives the members 16a, 16b the ability to wick off the corrosive liquid 14.

As can be seen in FIG. 2, the sleeves 32 are crimped at the bottoms ends thereof to thereby form the second ends 24a, 24b of the members 16a, 16b, with the bottom ends of the cores 30 being completely encased within the sleeves 32 and shielded from direct contact with the liquid 14. The upper ends of the sleeves 32 are open such that the upper ends of the conductive cores 30 extend beyond the upper ends of the sleeves, thereby forming the first ends 22a, 22b. Thus, as is apparent from FIG. 1, the conductive ends 22a, 22b extend outside of the container 12 and are readily accessible for connection with the meter 28.

An exemplary meter 28 for use with the sensor members 16a, 16b is illustrated in FIG. 4. The meter 28 is a device that senses changes in the capacitance of the sensor members 16a, 16b as the level of the liquid 14 changes and produces an analog output signal that is proportional to the corresponding liquid level. Preferably, the sensed capacitance of the sensor members 16a, 16b is converted by the meter 28 into amperes to form the output signal. In one embodiment, the output signal produced by the meter 28 ranges from 4–20 mA, regardless of the length of the sensor members 16a, 16b, with the 50% level of the liquid 14 being represented by an output of 12 mA. Meters that are capable of sensing capacitance and converting the sensed capacitance into an output signal are known in the art, and therefore the meter 28 is not described in further detail herein.

As shown in FIG. 4, the meter 28 includes a pair of terminals 34a, 34b on the bottom thereof which are adapted for engagement with the first ends 22a, 22b of the sensor members 16a, 16b. Since the first ends 22a, 22b of the members 16a, 16b are conductive, a suitable connection between the terminals 34a, 34b and the ends 22a, 22b provides the input to the meter 28 to allow sensing of the capacitance of the members 16a, 16b. The meter 28 is provided with a LCD readout 36 which displays an output indicative of the liquid level within the container 12. The readout 36 is preferably provided with a graduated liquid level scale (not shown), with the output signal displayed on the readout being located along the scale to provide an easy indication of the liquid level within the container. The meter 28 is provided with a self contained power source, such as a battery, or is connected to an external source of power, in order to provide electrical energy to the sensor members 16a, 16b necessary for the operation thereof.

The meter 28 is preferably sized so as to be convenient to carry and handle, thereby facilitating its use. In one embodiment, the meter 28 can be 3.5 inches long, 2.5 wide, and 1.0 inch thick, which is approximately the size of many modem day pagers. In addition, the meter 28 is preferably detachably connected to the first ends 22a, 22b of the members 16a, 16b such that the meter 28 can be removed from the sensor when a liquid level reading is not desired. The small size of the meter and its detachable connection to the sensor members permits a single meter 28 to be used in order to conduct liquid level readings for a plurality of containers, with the sensor members 16a, 16b remaining in place for future readings. Thus, the meter can be carried from container to container, and simply "plugged" onto the ends 22a, 22b of the sensor members 16a, 16b in order to easily conduct a reading at each container.

Figure 5A:
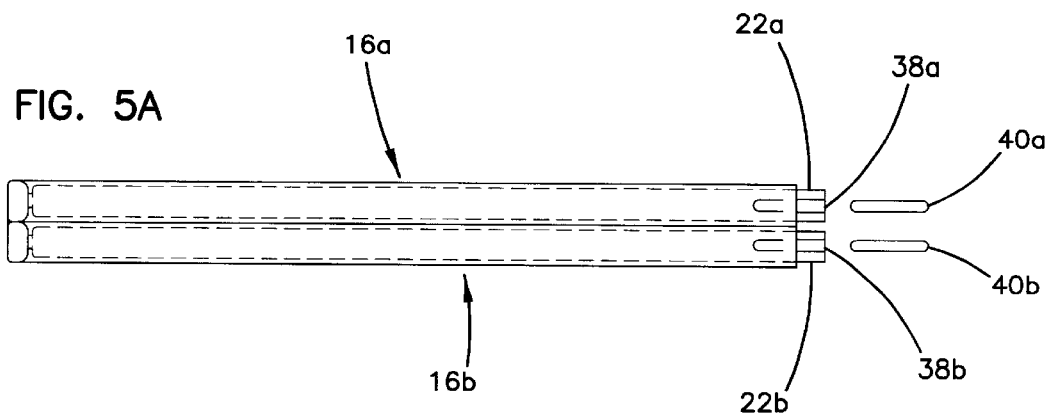
FIGS. 5A, 5B and 5C illustrate different approaches for connecting the sensor members and the meter.
Figure 5B:
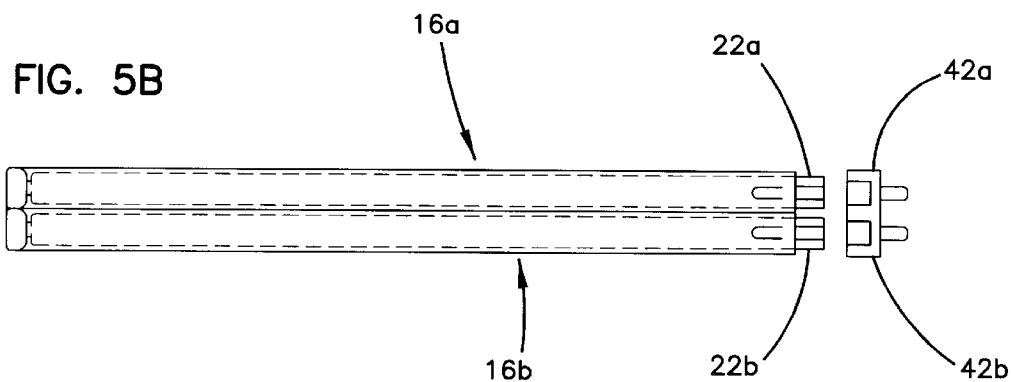
Figure 5C:
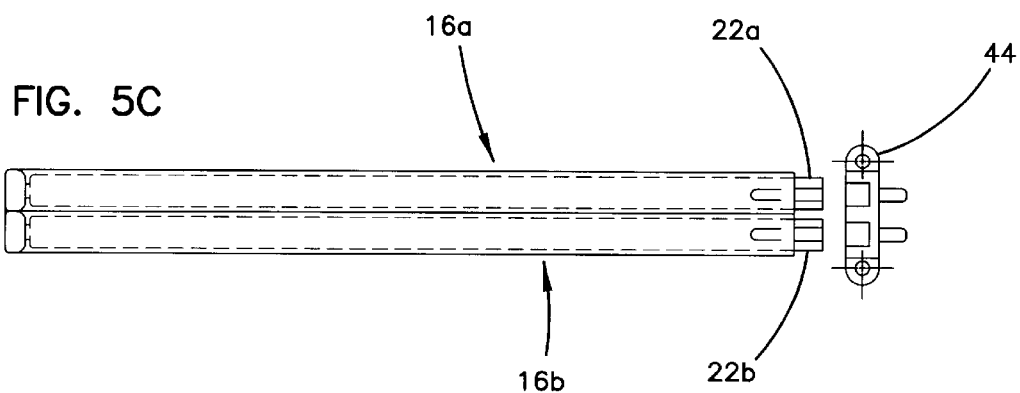

FIGS. 5A, 5B and 5C illustrate different configurations of the ends 22a, 22b for facilitating detachable connection between the sensor members 16a, 16b and the meter 28.

In FIG. 5A, it is seen that each of the ends 22a, 22b includes a conductive sleeve 38a, 38b fixedly secured within a bore formed in the respective end. The sleeves 38a, 38b can be secured within the bore through any suitable means, such as by a friction fit or by threading. The sleeves 38a, 38b, which are made from metal or any other conductive material, are thus in contact with a large number of the conductive fibers 31 and serve to conduct the electrical energy from the fibers to the meter 28. Each of the terminals 34a, 34b of the meter 28 includes a metal pin 40a, 40b associated therewith, which pins 40a, 40b are adapted for a friction fit within the sleeves 38a, 38b, respectively, such that an electrical connection is established between the sensor members 16a, 16b and the meter 28. Thus, in order to connect the meter to the sensor members, the ends 22a, 22b are slid into the terminals 34a, 34b of the meter, with the pins 40a, 40b fitting within the sleeves 38a, 38b to provide an electrical connection with the meter. The meter can be simply removed by lifting upward on the meter until the ends 22a, 22b disengage from the terminals 34a, 34b.

FIG. 5B illustrates an embodiment in which the terminals 34a, 34b of the meter 28 are provided with conductive grommets 42a, 42b that slide onto the outside surface of the ends 22a, 22b in a friction fit. The grommets 42a, 42b, which can be made of metal, contact a plurality of the conductive fibers 31, thus establishing an electrical connection between the sensor members 16a, 16b and the meter 28. Attachment and removal of the meter to the sensor members is permitted due to the friction fit connection between the grommets 42a, 42b and the ends 22a, 22b.

FIG. 5C illustrates an embodiment in which the terminals 34a, 34b of the meter 28 are provided with a conductive clamping device 44 designed to clamp onto the outer surface of the ends 22a, 22b. The conductive clamping device 44, which can be made of metal, contacts a plurality of the conductive fibers 31, thus establishing an electrical connection between the sensor members 16a, 16b and the meter 28. The clamping device 44 must be manually actuated in order to clamp onto, and permit removal of the device 44 from, the ends 22a, 22b.

It is to be realized that other forms of detachable connection between the meter and the ends 22a, 22b of the sensor members 16a, 16b can be utilized, as long as an electrical connection is provided by the connection.

Figure 6:
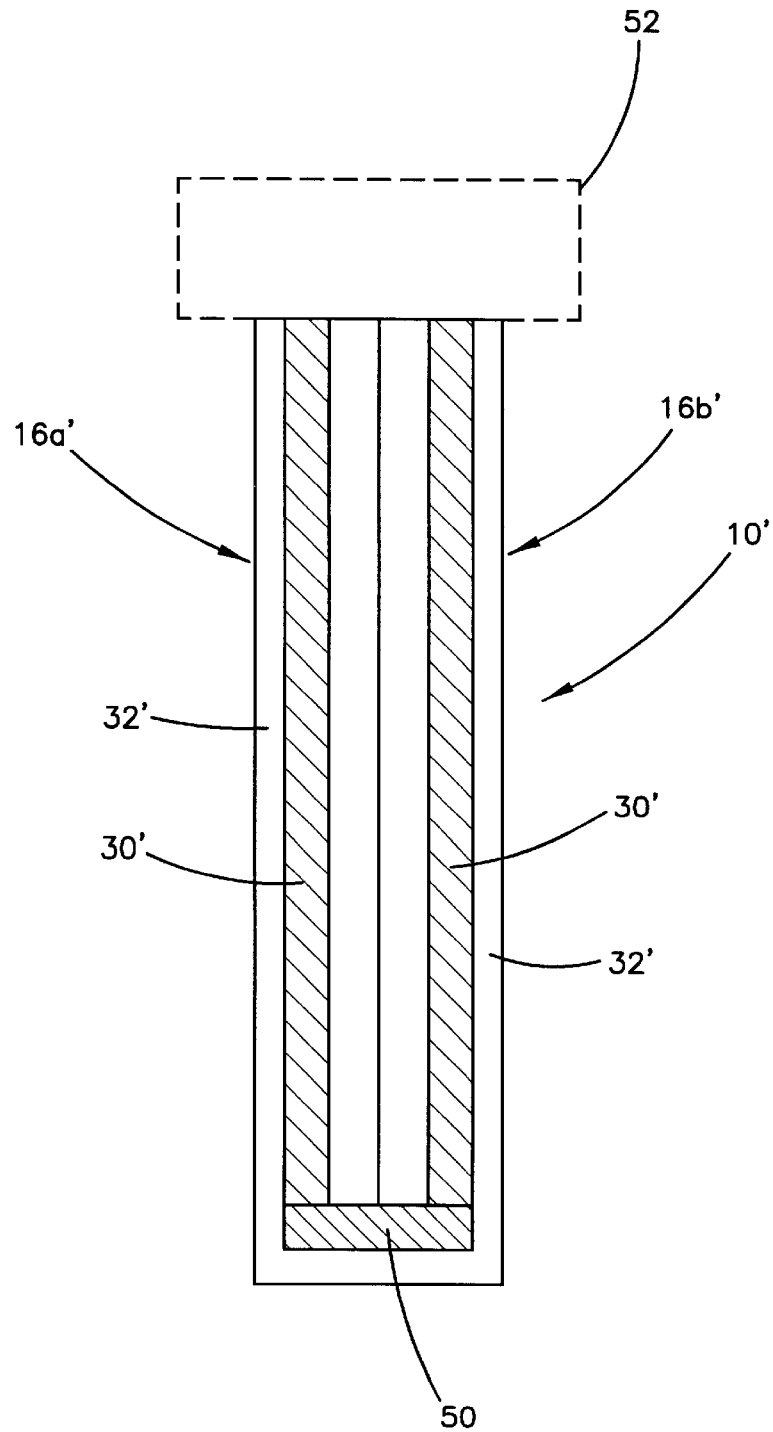
FIG. 6 illustrates another sensor in accordance with the principles of the present invention for sensing the temperature of a corrosive media within a container.

With a slight modification to the sensor 10 shown in FIGS. 1–5, a sensor 10' can be formed for sensing the temperature of the liquid 14 with the container 12. Referring to FIG. 6, the sensor 10' illustrated therein can be used to sense the temperature of the liquid within the container. The sensor 10' is substantially similar to the level sensor 10, with corresponding elements being referenced by the same reference number with a prime designation. The sensor 10' can be mounted on the container in the same manner as the sensor 10, or in any other suitable fashion, and like the sensor members 16a, 16b, the sensor members 16a', 16b' are intended to extend downward into the liquid adjacent to the bottom wall of the container. Each sensor member 16a', 16b' includes a central core 30' made from a non-metallic, electrically resistive material having a plurality of non-metallic conductive fibers embedded therein, with a non-metallic, electrically resistive sleeve 32' surrounding each core 30'. Thus, the sensor 10' is similar to the sensor 10.

However, the sensor 10' includes a conductive member 50 that is connected to the bottom end of each core 30' so as to interconnect the cores. The member 50 can be connected to the cores 30' by welding and the like. The conductive member 50 is preferably made from a non-metallic, electrically resistive material having a plurality of non-metallic, conductive fibers embedded therein. Preferably, the non-metallic, electrically resistive material of the member 50 is the same as the non-metallic, electrically resistive material of the cores 30', i.e. a polymeric material, such as perfluoroalkoxy (PFA). Likewise, the non-metallic, conductive fibers of the member 50 are preferably made from the same material as the non-metallic, conductive fibers of the cores 30', i.e. carbon fibers. However, if desired, the member 50 could be made from a different polymeric material and a different conductive fiber material than the cores 30'.

The non-metallic, conductive fibers of the member 50 preferably extend continuously from one end of the member to the other end, such that when the member 50 is connected to the cores 30', a relatively large portion of the conductive fibers in the member 50 will contact a relatively large portion of the conductive fibers in the cores 30' to ensure a good electrical connection between the cores 30' and the member 50. Further, like the cores 30', the conductive member 50 is surrounded by the non-metallic, electrically resistive material of the sleeves 32' to shield the member 50 from the corrosive effects of the liquid.

The temperature sensor 10' works on the principle that a change in the temperature of the liquid will cause a change in the electrical properties of the cores 30' and member 50. Thus, provided that the initial electrical properties of the sensor 10' are known for a given temperature, the electrical properties of the sensor 10' when in contact with the liquid can be measured and the corresponding liquid temperature can be derived therefrom. For instance, electrical current through the cores 30' will vary based upon the temperature of the liquid. Thus, by directing a current through the conductive circuit formed by the cores 30' and the member 50, the actual current flow can be measured and the corresponding temperature of the liquid derived therefrom. Since current, voltage and resistance are interrelated, it should be apparent that either of these parameters could be measured so as to derive the corresponding liquid temperature.

A meter 52 is preferably attached to the top of the sensor members 16a', 16b' in the same manner that the meter 28 attaches to the sensor members 16a, 16b. Thus, the meter 52 is in electrical contact with the cores 30' in order to direct electricity through the cores 30' and to sense the resulting electrical property. The meter 52 can be an ohmmeter, a voltmeter, an ammeter and the like, or any combination of the three.

Further, the functions of the meter 52 could be combined with the functions of the meter 28 into a single meter unit so that the single meter unit could be used interchangeably on either sensor 10, 10'. Such a single meter unit would allow a person to take a reading on one sensor, and then after reading, the meter unit could be attached to the other sensor in order to perform the reading. Thus, only a single meter would be needed to take readings on a plurality of different sensors.

The above specification, examples and data provide a complete description of the manufacture and use of the composition of the invention. Since many embodiments of the invention can be made without departing from the spirit and scope of the invention, the invention resides in the claims hereinafter appended.

We claim:

1. A sensor for use within a container containing a medium, comprising:

first and second elongate, conductive sensor members each of which has a longitudinal axis and is dimensioned to extend into the medium, said first and second sensor members each including a core made from a non-metallic, electrically resistive material having a plurality of non-metallic conductive fibers embedded therein, each said core having opposite ends and said fibers being oriented parallel to the longitudinal axes of the first and second sensor members and extending continuously between the ends of said cores;

wherein a difference in capacitance between the first and second members provides an indication of the level of the medium within the container.

2. The sensor according to claim 1, wherein said non-metallic, electrically resistive material comprises a polymeric material.

3. The sensor according to claim 2, wherein said polymeric material comprises perfluoroalkoxy.

4. The sensor according to claim 1, wherein said non-metallic, conductive fibers comprise carbon fibers.

5. The sensor according to claim 1, wherein each of said first and second sensor members further comprises a non-metallic, electrically resistive sleeve surrounding said core.

6. The sensor according to claim 5, said non-metallic, electrically resistive sleeve comprises a polymeric material.

7. The sensor according to claim 6, wherein said polymeric material comprises perfluoroalkoxy.

8. The sensor according to claim 1, wherein said fibers comprise approximately 50% by area of a cross-sectional area of each said core.

9. The sensor according to claim 1, wherein one of said ends of each said core is adapted for connection to a meter.

10. The sensor according to claim 9, wherein said one end of each said core includes a conductive sleeve connected thereto.

11. The sensor according to claim 9, wherein said one end of each said core is cylindrical in shape and is connectable to the meter through a friction fit.

12. A sensor for use within a container containing a medium, comprising:

first and second elongate, conductive sensor members each of which has a longitudinal axis and is dimensioned to extend into the medium, said first and second sensor members each including a core made from a non-metallic, electrically resistive material having a plurality of non-metallic conductive fibers embedded therein, each said core having opposite ends and said fibers being oriented parallel to the longitudinal axes of the first and second sensor members and extending continuously between the ends of said cores; and a conductive member interconnecting said cores adjacent one of said ends, said conductive member comprising a non-metallic, electrically resistive material having a plurality of non-metallic, conductive fibers embedded therein, and said fibers extend continuously from one end of said conductive member to an opposite end of said conductive member whereby said fibers of said conductive member contact said fibers of said first and second sensor members wherein the current flow through the first and second sensor members and the conductive member provides an indication of the temperature of the medium within the container.

13. The sensor according to claim 12, wherein said non-metallic, electrically resistive material of said conductive member comprises a polymeric material.

14. The sensor according to claim 13, wherein said polymeric material of said conductive member comprises perfluoroalkoxy.

15. The sensor according to claim 12, wherein said non-metallic, conductive fibers of said conductive member comprise carbon fibers.

16. A sensor member, comprising:
an elongate, conductive rod having a longitudinal axis, said rod including a core made from a non-metallic, electrically resistive material having a plurality of non-metallic conductive fibers embedded therein, said core having opposite ends and said fibers being oriented parallel to the longitudinal axis of said rod and extending continuously between the ends of said core.

17. The sensor member according to claim 16, wherein said non-metallic, electrically resistive material comprises a polymeric material.

18. The sensor member according to claim 16, wherein said non-metallic, conductive fibers comprise carbon fibers.

19. The sensor member according to claim 16, wherein said rod further comprises a non-metallic, electrically resistive sleeve surrounding said core.

20. The sensor member according to claim 19, said non-metallic, electrically resistive sleeve comprises a polymeric material.

* * * * *